US012757424B2

(12) United States Patent
Chen et al.

(10) Patent No.: US 12,757,424 B2
(45) Date of Patent: Oct. 6, 2026

(54) SELECTIVE DEPOSITION OF GATE DIELECTRIC LAYER OF SEMICONDUCTOR DEVICE AND THE SEMICONDUCTOR DEVICE MANUFACTURED THEREBY

(71) Applicant: TAIWAN SEMICONDUCTOR MANUFACTURING COMPANY, LTD., Hsinchu (TW)

(72) Inventors: Yi-Hsiu Chen, Hsinchu (TW); Olivia Pei-Hua Lee, Hsinchu (TW); Kenichi Sano, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 359 days.

(21) Appl. No.: 18/401,787

(22) Filed: Jan. 2, 2024

(65) Prior Publication Data

US 2025/0220945 A1 Jul. 3, 2025

(51) Int. Cl.

| | |
|---|---|
| ***H10D 30/43*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |

(52) U.S. Cl.

CPC ........... *H10D 30/43* (2025.01); *H10D 30/014* (2025.01); *H10D 30/6735* (2025.01); *H10D 30/6757* (2025.01); *H10D 62/121* (2025.01); *H10D 64/021* (2025.01); *H10D 64/018* (2025.01)

(58) Field of Classification Search

CPC .... H10D 30/014; H10D 30/019; H10D 30/43; H10D 30/501; H10D 30/6735; H10D 30/6757; H10D 62/121; H10D 64/01336; H10D 64/017; H10D 64/018; H10D 64/021; H10P 14/61

See application file for complete search history.

(56) References Cited

U.S. PATENT DOCUMENTS

| | | | | |
|---|---|---|---|---|
| 2022/0320309 | A1 * | 10/2022 | Chen | H10D 30/6739 |
| 2022/0367683 | A1 * | 11/2022 | Chen | H10D 30/031 |
| 2022/0406909 | A1 * | 12/2022 | Chiu | H10D 30/6729 |
| 2023/0052295 | A1 * | 2/2023 | Liao | H10D 62/115 |
| 2023/0068668 | A1 * | 3/2023 | Liu | H10D 30/0217 |
| 2024/0234530 | A1 * | 7/2024 | Tsai | H10D 64/018 |
| 2024/0282819 | A1 * | 8/2024 | Chen | H10D 62/151 |

(Continued)

*Primary Examiner* — Telly D Green

(74) *Attorney, Agent, or Firm* — Birch, Stewart, Kolasch & Birch, LLP

(57) ABSTRACT

A method for manufacturing a semiconductor device includes: forming a semiconductor structure on a substrate; forming a blocking layer to cover side surfaces of spacers of the semiconductor structure by subjecting a nitrogen-containing dielectric material of the spacers to an azidation reaction with an azide compound and a click reaction with a plurality of precursor molecules, each of which includes a head group containing an alkyne radical and a tail group connected to the head group; forming a gate dielectric layer surrounding nanosheet segments of the semiconductor structure; removing the blocking layer; and forming a metal filling layer which is in direct contact with the spacers, and which surrounds the nanosheet segments and is separated from the nanosheet segments by the gate dielectric layer.

20 Claims, 10 Drawing Sheets

(56) References Cited

U.S. PATENT DOCUMENTS

| | | | | |
|---|---|---|---|---|
| 2024/0282838 | A1* | 8/2024 | Chang | H10D 30/6735 |
| 2024/0297228 | A1* | 9/2024 | Loh | H10D 30/6729 |
| 2024/0321883 | A1* | 9/2024 | Chen | H10D 30/014 |
| 2024/0321990 | A1* | 9/2024 | Shih | H10D 30/017 |
| 2024/0387669 | A1* | 11/2024 | Siao | H10D 30/6735 |
| 2024/0413220 | A1* | 12/2024 | Hsieh | H10D 30/6735 |
| 2025/0014947 | A1* | 1/2025 | Sano | H10D 84/038 |
| 2025/0203955 | A1* | 6/2025 | Huang | H10D 30/797 |
| 2025/0220945 | A1* | 7/2025 | Chen | H10D 30/019 |
| 2025/0275185 | A1* | 8/2025 | Chiu | H10D 30/43 |
| 2025/0357316 | A1* | 11/2025 | Chen | H10D 30/6219 |
| 2025/0364239 | A1* | 11/2025 | Lin | H10D 30/6735 |

* cited by examiner

SELECTIVE DEPOSITION OF GATE DIELECTRIC LAYER OF SEMICONDUCTOR DEVICE AND THE SEMICONDUCTOR DEVICE MANUFACTURED THEREBY

BACKGROUND

The integration density of various electronic components, for example, but not limited to, transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, resulting resistance and parasitic capacitance increase, leading to larger resistance-capacitance (RC) time delay for integrated chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
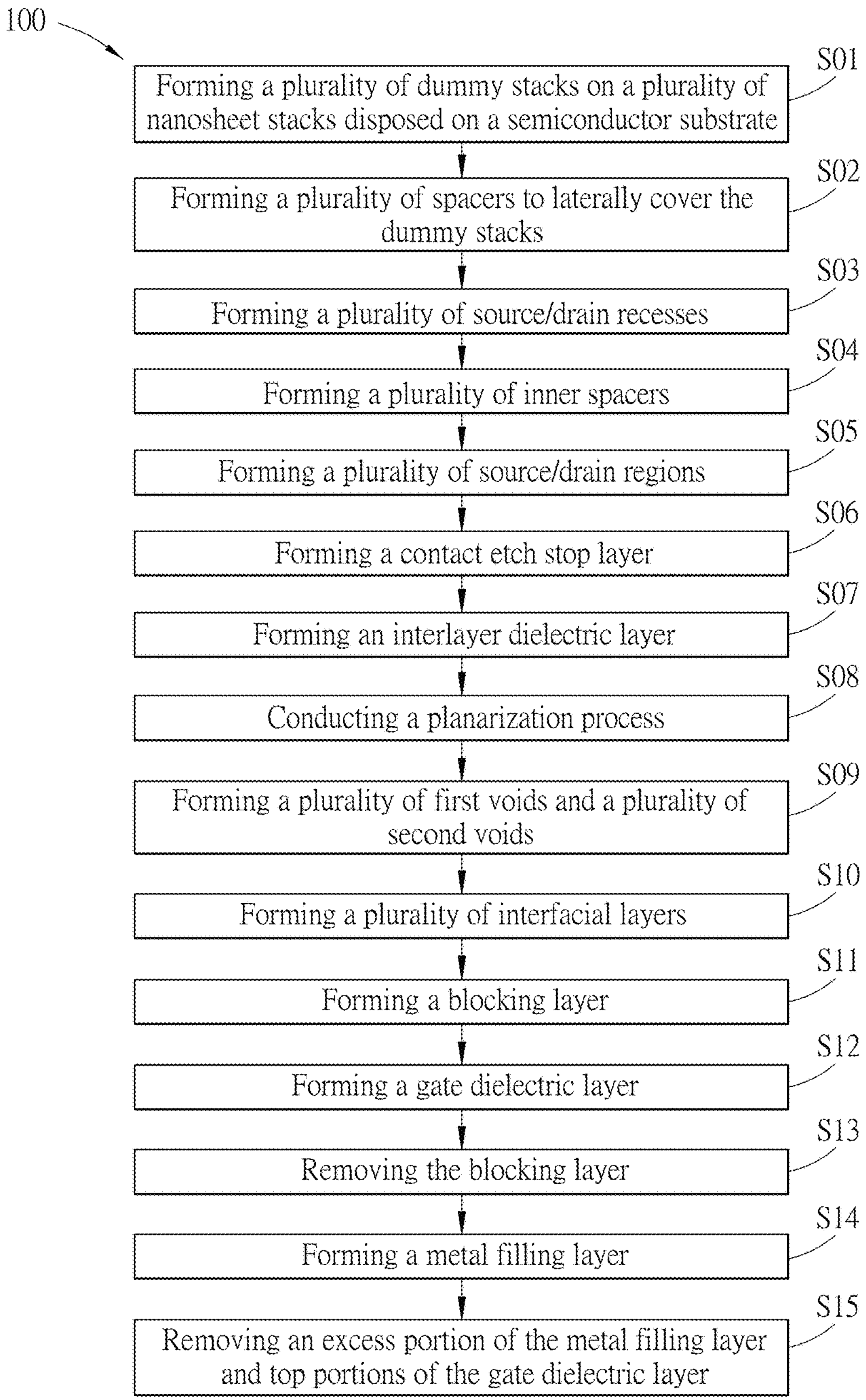
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "bottom," "below," "uppermost," "lowermost," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects±10%, in some aspects±5%, in some aspects±2.5%, in some aspects±1%, in some aspects±0.5%, and in some aspects±0.1% from the specified amount, as such variations are appropriate to perform the disclosed methods or employ the disclosed compositions.

The term "source/drain region(s)" may refer to a source or a drain, individually or collectively dependent upon the context.

The integration density of various electronic components, for example, but not limited to, transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, resulting resistance and parasitic capacitance increase, leading to larger resistance-capacitance (RC) time delay for integrated chips. In a method for manufacturing a semiconductor device, a gate dielectric of a gate structure is generally formed by globally depositing a high-k (high dielectric constant) dielectric material to form a dielectric layer. When the gate dielectric is formed, the dielectric layer formed of the high-k dielectric material also laterally covers sidewall spacers due to the global deposition, resulting in an increased parasitic capacitance and thus leading to larger resistance-capacitance (RC) time delay for the semiconductor device thus manufactured. The present disclosure is directed to a method for manufacturing a semiconductor device with reduced capacitance by providing a selective deposition process for forming the gate dielectric of the gate structure to avoid deposition of the high-k dielectric material on the sidewall spacers when the gate dielectric of the gate structure is formed.

Figure 17:
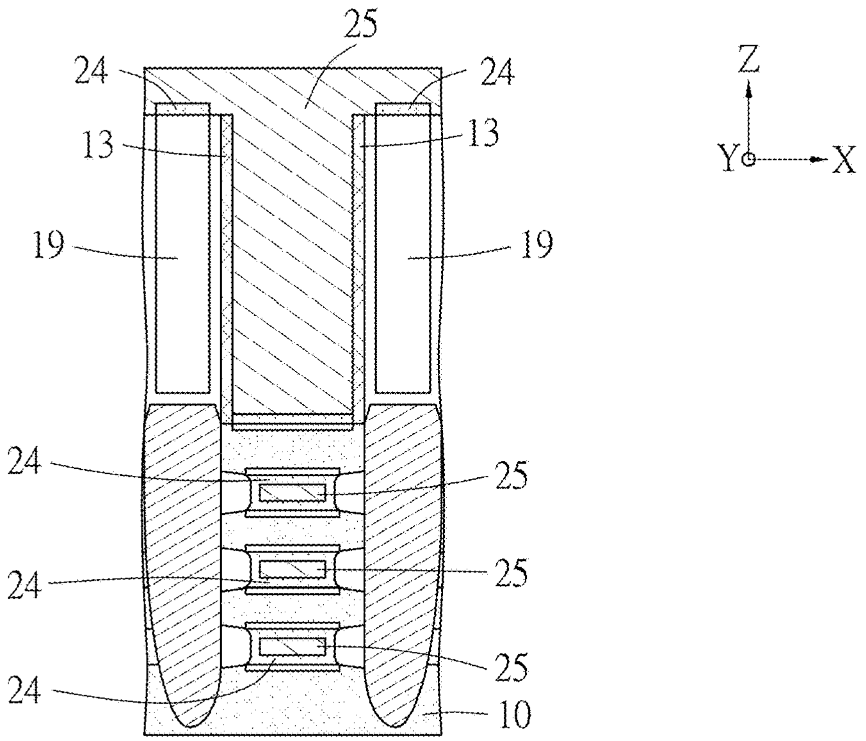
Figure 18:
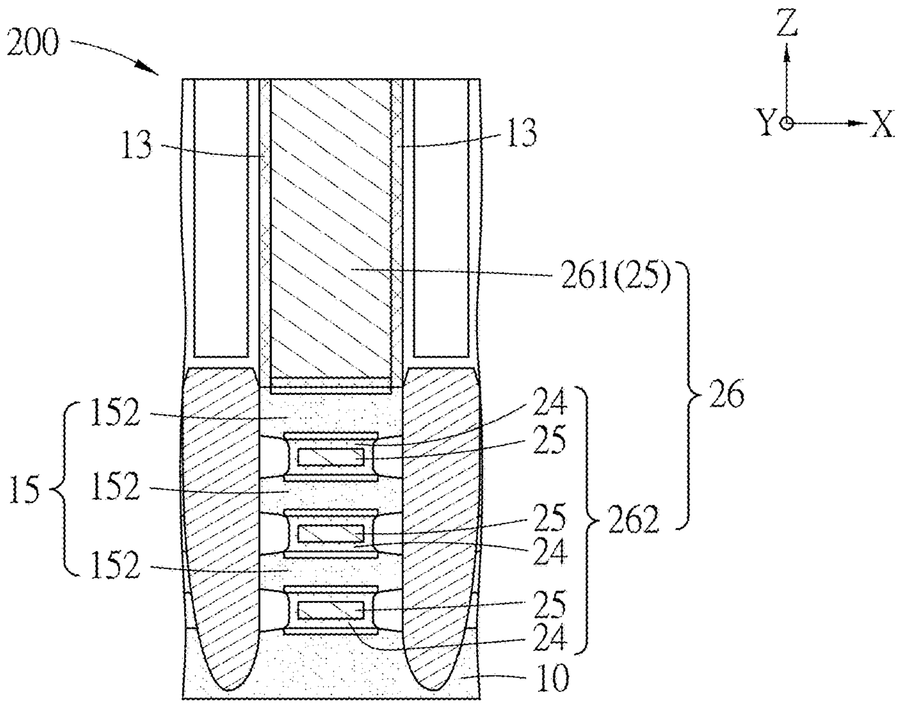

FIG. 1 is a flow diagram illustrating an exemplary method 100 for manufacturing an exemplary semiconductor device 200 as shown in FIG. 18 in accordance with some embodiments. FIGS. 2 to 17 are schematic views of some intermediate stages of the manufacturing method 100 as depicted in FIG. 1 in accordance with some embodiments. Some portions are omitted in FIGS. 2 to 18 for the sake of brevity. Additional steps can be provided before, after or during the method 100, and some of the steps described herein may be replaced by other steps or be eliminated.

Figure 2:
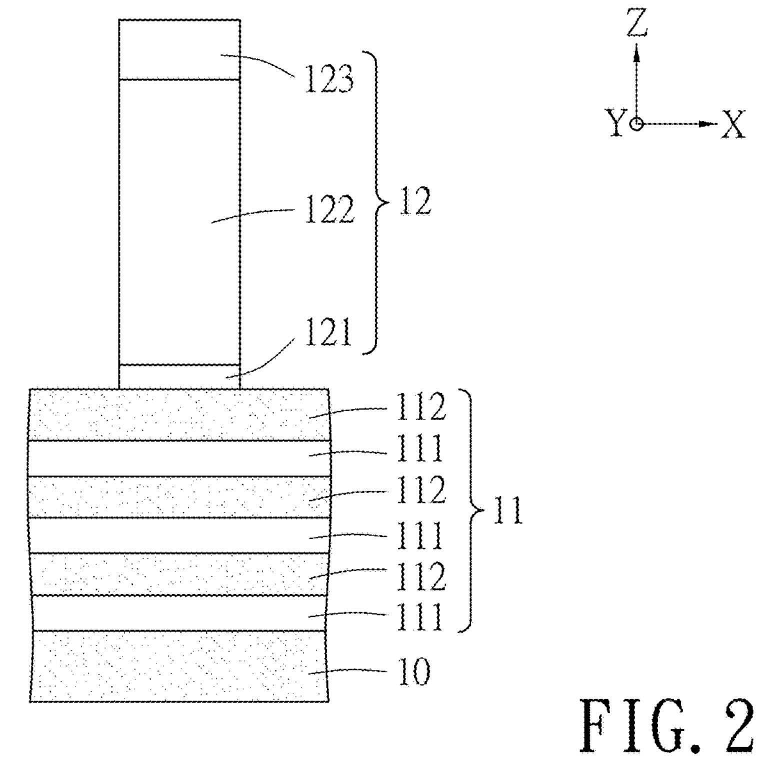
FIGS. 2 to 18 are schematic views showing some intermediate stages of the method depicted in FIG. 1.

Referring to FIG. 1 and the example illustrated in FIG. 2, the method 100 begins at step S01, where a plurality of dummy stacks 12 are formed on a plurality of nanosheet stacks 11 disposed on a semiconductor substrate 10. The nanosheet stacks 11 extend in an X direction parallel to a bottom surface of the semiconductor substrate 10, and are spaced apart from each other in a Y direction parallel to the bottom surface of the semiconductor substrate 10 and transverse to the X direction. One of the nanosheet stacks 11 is shown in FIG. 2. The dummy stacks 12 formed on the nanosheet stacks 11 are spaced apart from each other in the X direction. One of the dummy stacks 12 is shown in FIG. 2.

In some embodiments, the semiconductor substrate 10 may include, for example, but not limited to, an elemental semiconductor or a compound semiconductor. The elemental semiconductor includes a single species of atoms, such as silicon (Si) or germanium (Ge) in column XIV of the periodic table, and may be in a crystal form, a polycrystalline form, or an amorphous form. Other suitable elemental semiconductor materials are within the contemplated scope of the present disclosure. The compound semiconductor includes two or more elements, and examples thereof may include, but not limited to, silicon carbide, gallium arsenide, gallium phosphide, indium phosphide, indium arsenide, indium antimonide, silicon germanium, gallium arsenide phosphide, aluminum indium arsenide, aluminum gallium arsenide, gallium indium arsenide, gallium indium phosphide, and gallium indium arsenide phosphide. Other suitable compound semiconductor materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate 10 may include a multilayer compound semiconductor substrate. In some embodiments, the semiconductor substrate 10 may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable P-type dopant materials are within the contemplated scope of the present disclosure. Alternatively, the SOI substrate may be doped with an N-type dopant, for example, but not limited to, nitrogen (N), phosphorus (P), or arsenic (As). Other suitable N-type dopant materials are within the contemplated scope of the present disclosure.

Each of the nanosheet stacks 11 includes a plurality of first nanosheets 111 and a plurality of second nanosheets 112 alternately disposed on the semiconductor substrate 10 in a Z direction transverse to the X direction and the Y direction. In some embodiments, an uppermost one of the second nanosheets 112 is disposed over an uppermost one of the first nanosheets 111 such that an uppermost nanosheet of each of the nanosheet stacks 11 is the uppermost one of the second nanosheets 112. In some embodiments, a lowermost one of the first nanosheets 111 is disposed below a lowermost one of the second nanosheets 112 such that a lowermost nanosheet of each of the nanosheet stacks 11 is the lowermost one of the first nanosheets 111. The first nanosheets 111 include a first semiconductor material, and the second nanosheets 112 include a second semiconductor material. The first semiconductor material and the second semiconductor material have different etch selectivity and/or oxidation rates. In some embodiments, the second semiconductor material may be a semiconductor material the same as that of the semiconductor substrate 10. In some embodiments, the first semiconductor material is silicon germanium (SiGe), and the second semiconductor material is silicon (Si). Other materials suitable for the first nanosheets 111 and the second nanosheets 112 are within the contemplated scope of the present disclosure. Each of the first nanosheets 111 and each of the second nanosheets 112 may have the same thickness or different thicknesses in the Z direction.

In some embodiments, the nanosheet stacks 11 are formed by patterning a semiconductor stack (not shown) disposed on the semiconductor substrate 10. In some embodiments, the semiconductor stack includes a plurality of first semiconductor layers and a plurality of second semiconductor layers alternately disposed on the semiconductor substrate 10 in the Z direction. In some embodiments, an uppermost one of the second semiconductor layers is disposed over an uppermost one of the first semiconductor layers such that an uppermost layer of the semiconductor stack is the uppermost one of the second semiconductor layers. In some embodiments, a lowermost one of the first semiconductor layers is disposed below a lowermost one of the second semiconductor layers such that a lowermost layer of the semiconductor stack 11 is the lowermost one of the first semiconductor layers. The first semiconductor layers include the first semiconductor material, and the second semiconductor layers include the second semiconductor material. Each of the first semiconductor layers and each of the second semiconductor layers may have the same thickness or different thicknesses in the Z direction. The first nanosheets 111 of each of the nanosheet stacks 11 are formed by patterning the first semiconductor layers in the semiconductor stack, and the second nanosheets 112 of each of the nanosheet stacks 11 are formed by patterning the second semiconductor layers in the semiconductor stack.

In some embodiments, each of the dummy stacks 12 includes a dummy gate dielectric 121 disposed on the nanosheet stacks 11, a dummy gate 122 disposed on the dummy gate dielectric 121, and a hard mask 123 disposed on the dummy gate 122 opposite to the dummy gate dielectric 121. In some embodiments, the dummy stacks 12 may be formed by conformally and sequentially forming a dummy dielectric layer, a dummy gate layer, and a hard mask layer on the nanosheet stacks 11, and patterning the hard mask layer, the dummy gate layer, and the dummy dielectric layer. Each of the dummy dielectric layer, the dummy gate layer, and the hard mask layer may be formed using a suitable deposition process as known to those skilled in the art of semiconductor fabrication, for example, but not limited to, atomic layer deposition (ALD), chemical vapor deposition (CVD), physical vapor deposition (PVD), plasma-enhanced ALD (PEALD), or plasma-enhanced CVD (PECVD). Other suitable processes are within the contemplated scope of the present disclosure. The dummy dielectric layer may include a dielectric material, for example, but not limited to, silicon oxide. Other suitable dielectric materials are within the contemplated scope of the present disclosure. The dummy gate layer may include, for example, but not limited to, polycrystalline silicon, microcrystal silicon, amorphous silicon, or combinations thereof. Other suitable materials are within the contemplated scope of the present disclosure. The hard mask layer may include, for example, but not limited to, silicon nitride, silicon oxide, silicon oxynitride, or combinations thereof. Other suitable materials are within the contemplated scope of the present disclosure. The hard mask layer, the dummy gate layer, and the dummy dielectric layer may be patterned using one or more suitable etching processes as known to those skilled in the art of semiconductor fabrication, for example, but not limited to, a dry etching process, a wet etching process, or a combination thereof. Other suitable processes are within the contemplated scope of the present disclosure. Before one or more etching processes are conducted, a lithography process may be conducted to develop a resist layer on the hard mask layer. Other materials and processes suitable for forming the dummy stacks 12 are within the contemplated scope of the present disclosure.

Figure 3:
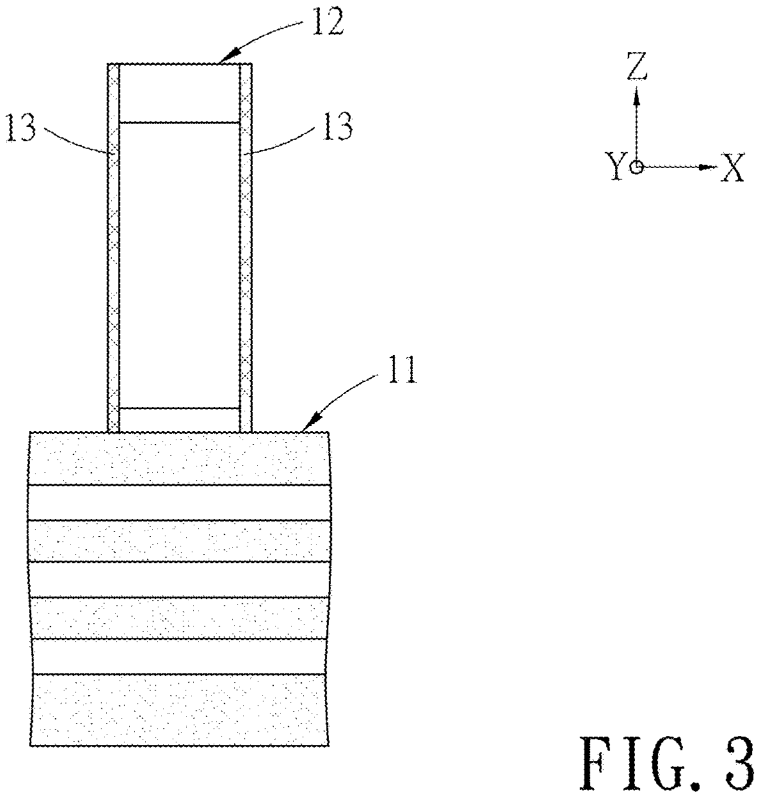

Referring to FIG. 1 and the example illustrated in FIG. 3, the method 100 proceeds to step S02, where a plurality of spacers 13 are formed to laterally cover the dummy stacks 12. In FIG. 3, only a pair of the spacers 13 is shown to laterally cover two opposite side surfaces of a corresponding one of the dummy stacks 12. In some embodiments, the spacers 13 may be formed by conformally depositing a spacer layer (not shown) on the structure shown in FIG. 2 and subjecting the spacer layer to an anisotropic etching process to etch away the horizontal portions of the spacer layer, so as to form the spacers 13 which extend upwardly from the nanosheet stacks 11 and which laterally cover the dummy stacks 12. In some embodiments, the conformal deposition may be conducted by a suitable deposition process as known to those skilled in the art of semiconductor fabrication, for example but not limited to, PVD, CVD, PECVD, ALD, or PEALD. Other suitable processes are within the contemplated scope of the present disclosure. In some embodiments, the anisotropic etching process is a dry anisotropic etching process. Other suitable processes are within the contemplated scope of the present disclosure. In some embodiments, the spacers 13 include a nitrogen-containing dielectric material, for example, but not limited to, silicon nitride, silicon oxynitride, silicon carbonitride, silicon oxycarbonitride, or combinations thereof. Other suitable nitrogen-containing dielectric materials are within the contemplated scope of the present disclosure.

Figure 4:
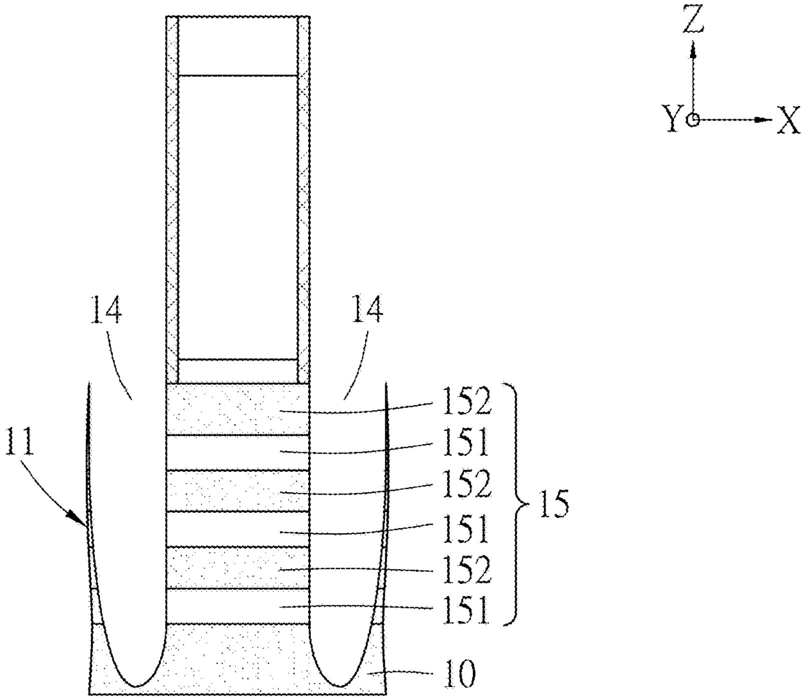

Referring to FIG. 1 and the example illustrated in FIG. 4, the method 100 proceeds to step S03, where each of the nanosheet stacks 11 is recessed to form a plurality of source/drain recesses 14. In some embodiments, each of the nanosheet stacks 11 is recessed by an anisotropic etching process to form a plurality of the source/drain recesses 14 and a plurality of channel regions 15 disposed alternately with the source/drain recesses 14 in the X direction. One of the channel regions 15 is shown in FIG. 4. Each of the channel regions 15 is disposed between two adjacent ones of the source/drain recesses 14. The anisotropic etching process may be a suitable anisotropic etching process as known to those skilled in the art of semiconductor fabrication, for example, but not limited to, a dry anisotropic etching process. Other suitable processes are within the contemplated scope of the present disclosure.

Each of the channel regions 15 includes a plurality of first nanosheet segments 151 and a plurality of second nanosheet segments 152 alternately disposed on the semiconductor substrate 10 in the Z direction. In some embodiments, an uppermost one of the second nanosheet segments 152 is disposed over an uppermost one of the first nanosheet segments 151 such that an uppermost nanosheet segment of each of the channel regions 15 is the uppermost one of the second nanosheet segments 152. In some embodiments, a lowermost one of the first nanosheet segments 151 is disposed below a lowermost one of the second nanosheet segments 152 such that a lowermost nanosheet segment of each of the channel regions 15 is the lowermost one of the first nanosheet segments 151. The first nanosheet segments 151 include the first semiconductor material, and the second nanosheet segments 152 include the second semiconductor material. In some embodiments, the first nanosheet segments 151 include silicon germanium (SiGe), and the second nanosheet segments 152 include silicon (Si).

Figure 5:
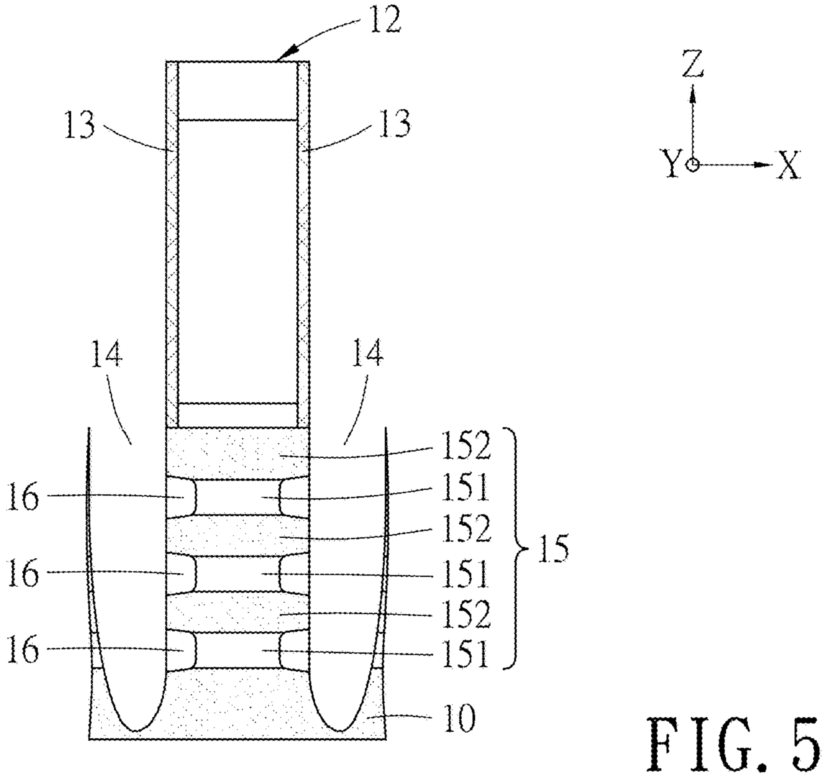

Referring to FIG. 1 and the example illustrated in FIG. 5, the method 100 proceeds to step S04, where a plurality of inner spacers 16 are formed. The inner spacers 16 are formed such that each pair of the inner spacers 16 laterally covers two opposite side surfaces of a corresponding on of the first nanosheet segments 151. In some embodiments, the inner spacers 16 may be formed by laterally etching the first nanosheet segments 151 to form lateral recesses (not shown), conformally depositing an inner spacer layer (not shown), and subjecting the inner spacer layer to an isotropic etching process. In some embodiments, the first nanosheet segments 151 are laterally etched by an isotropic etching process to remove two opposite side portions of each of the first nanosheet segments 151 based on a relatively high etching selectivity of the first nanosheet segments 151 with respect to the second nanosheet segments 152, so as to form the lateral recesses. In some embodiments, the isotropic etching process is, for example, but not limited to, a wet isotropic etching process. In some embodiments, the inner spacer layer is conformally deposited to cover the dummy stacks 12, the spacers 13, the channel regions 15, and the semiconductor substrate 10. In some embodiments, the conformal deposition may be conducted by a suitable deposition process as known to those skilled in the art of semiconductor fabrication, for example but not limited to, PVD, CVD, PECVD, ALD, or PEALD. Other suitable processes are within the contemplated scope of the present disclosure. In some embodiments, the inner spacer layer may include, for example, but not limited to, silicon oxide, silicon nitride, silicon carbide, silicon oxycarbide, silicon oxynitride, silicon carbonitride, silicon oxycarbonitride, or combinations thereof. Other suitable materials are within the contemplated scope of the present disclosure. In some embodiments, the inner spacer layer is subjected to an isotropic etching process to form the inner spacers 16. In some embodiments, the isotropic etching process may be a dry isotropic etching process, a wet isotropic etching process, or a combination thereof. Other suitable processes are within the contemplated scope of the present disclosure.

Figure 6:
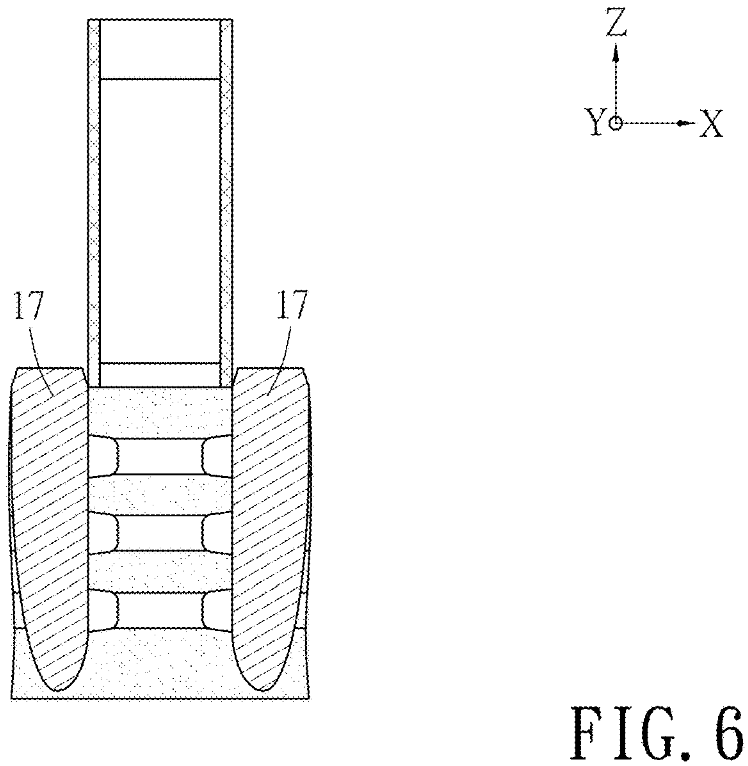

Referring to FIG. 1 and the example illustrated in FIG. 6, the method 100 proceeds to step S05, where a plurality of source/drain regions 17 are formed. In some embodiments, the source/drain regions 17 are formed by growing an epitaxial layer in the source/drain recesses 14 along the inner spacers 16 and the second nanosheet segments 152 (see FIG. 5) through epitaxial growth. In some embodiments, the technique for conducting the epitaxial growth may include, for example, but not limited to, a low pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process, or combinations thereof. In some embodiments, the technique for conducting the epitaxial growth may include, for example, but not limited to, a cyclic deposition-etch (CDE) epitaxy process, a selective epitaxial growth (SEG) process, or a combination thereof. Other suitable processes are within the contemplated scope of the present disclosure. The source/drain regions 17 may be doped with germanium (Ge), boron (B), phosphorus (P), or arsenic (As). For example, in some embodiments, when the source/drain regions 17 to be formed are n-FET source/drain regions, the epitaxial layer is grown in the source/drain recesses 14 along the inner spacers 16 and the second nanosheet segments 152 through an epitaxial growth process with, for example, phosphorus doping. In some embodiments, when the source/drain regions 17 to be formed are p-FET source/drain regions, the epitaxial layer is grown in the source/drain recesses 14 along the inner spacers 16 and the second nanosheet segments 152 through an epitaxial growth process with, for example, geranium doping.

Figure 7:
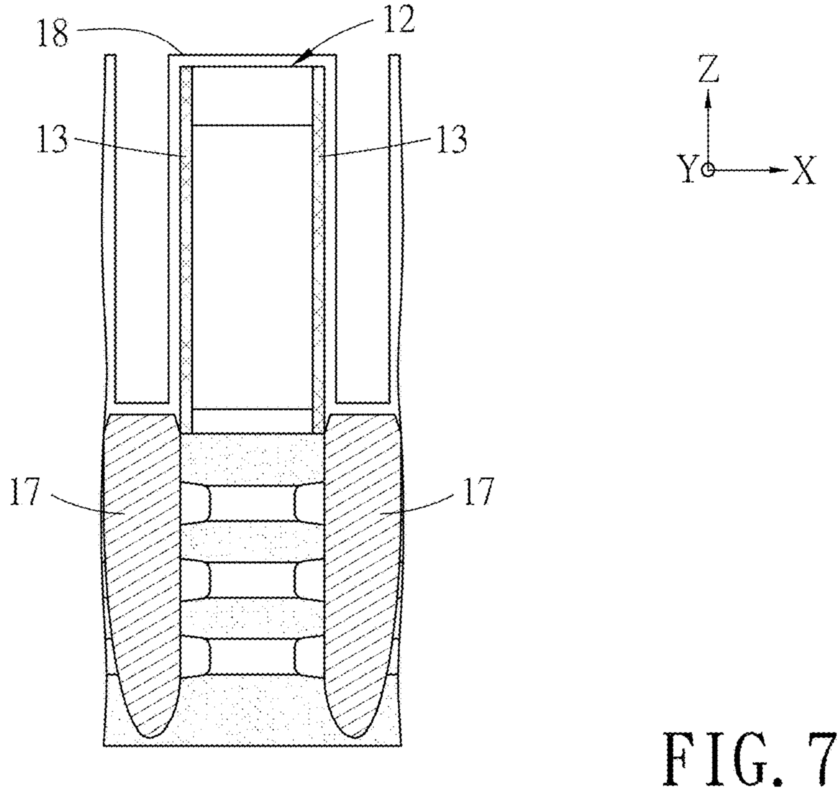

Referring to FIG. 1 and the example illustrated in FIG. 7, the method 100 proceeds to step S06, where a contact etch stop layer (CESL) 18 is formed. The CESL 18 is conformally deposited on the structure shown in FIG. 6 to cover the source/drain regions 17, the spacers 13, and the dummy stacks 12. In some embodiments, the CESL 18 may include, for example, but not limited to, silicon nitride, carbon-doped silicon nitride, or a combination thereof. Other suitable materials are within the contemplated scope of the present disclosure. In some embodiments, the CESL 18 may be deposited by a suitable deposition process as known to those skilled in the art of semiconductor fabrication, for example, but not limited to, PVD, CVD, PECVD, ALD, or PEALD. Other suitable processes are within the contemplated scope of the present disclosure.

Figure 8:
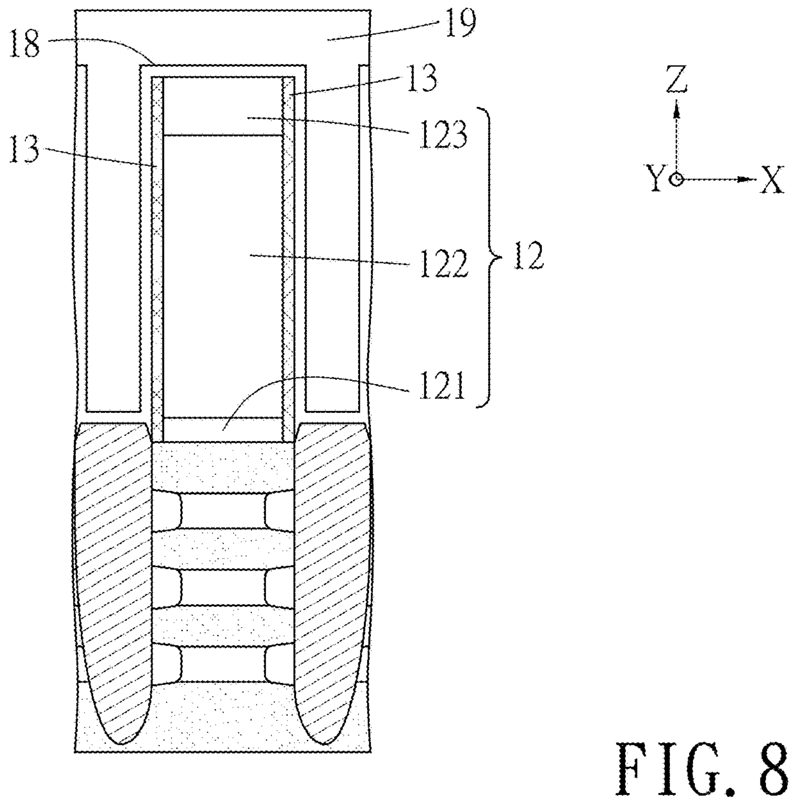

Referring to FIG. 1 and the example illustrated in FIG. 8, the method 100 proceeds to step S07, where an interlayer dielectric (ILD) layer 19 is formed. The ILD 19 is deposited over the CESL 18. In some embodiments, the ILD layer 19 may include, for example, but not limited to, silicon oxide, silicon nitride, silicon oxynitride, carbon doped silicon oxide, or combinations thereof. Other suitable materials are within the contemplated scope of the present disclosure. In some embodiments, the ILD layer 19 may be deposited over the CESL 18 by a suitable deposition process as known to those skilled in the art of semiconductor fabrication, for example but not limited to, PVD, CVD, PECVD, ALD, or PEALD. Other suitable processes are within the contemplated scope of the present disclosure.

Figure 9:
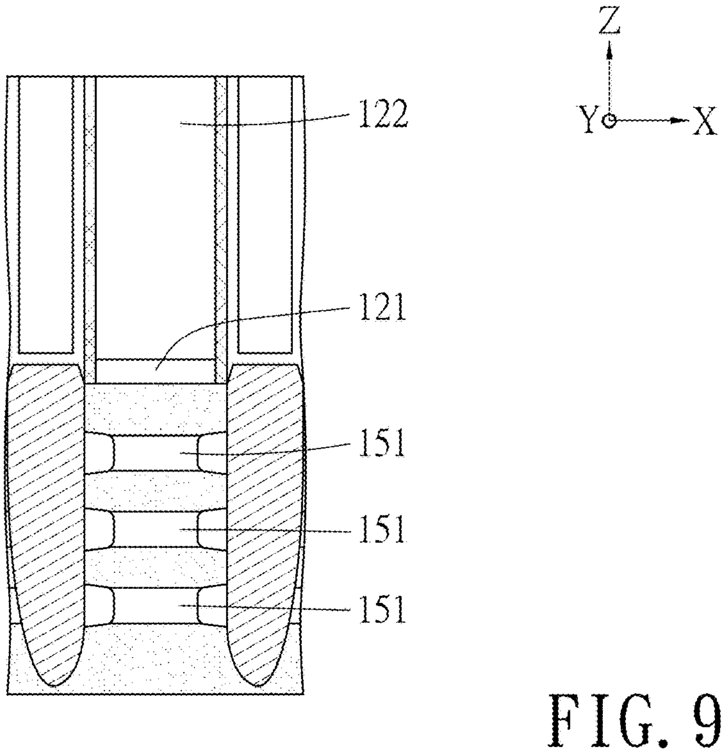

Referring to FIG. 1 and the example illustrated in FIG. 9, the method 100 proceeds to step S08, where a planarization process is conducted. The structure shown in FIG. 8 is subjected to the planarization process (for example, but not limited to, chemical mechanical planarization (CMP)) to remove an excess portion of the ILD layer 19, portions of the CESL 18, portions of the spacers 13, and the hard mask 123 of each of the dummy stacks 12 until a top surface of the dummy gate 122 of each of the dummy stacks 12 is exposed.

Figure 10:
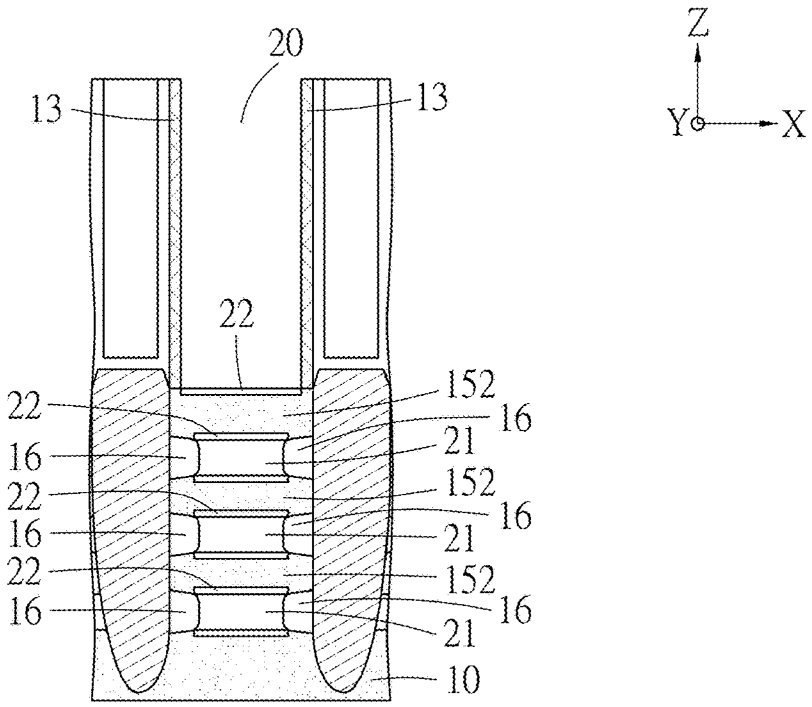

Referring to FIG. 1 and the examples illustrated in FIGS. 9 and 10, the method 100 proceeds to step S09, where a plurality of first voids 20 and a plurality of second voids 21 are formed. One of the first voids 20 is shown in FIG. 10. In some embodiments, the dummy gate 122 and the dummy gate dielectric 121 of each of the dummy stacks 12 and the first nanosheet segments 151 are removed by one or more suitable etching processes (for example but not limited to, a wet etching process, a dry etching process, or a combination thereof) to form a plurality of the first voids 20 and a plurality of the second voids 21. Each of the first voids 20 is defined by two corresponding ones of the spacers 13. In the plurality of the second voids 21 disposed below a corresponding one of the first voids 20, a lowermost one of the second voids 21 is defined by two corresponding ones of the inner spacers 16, a corresponding one of the second nanosheet segments 152 and the semiconductor substrate 10, and each of the other ones of the second voids 21 is defined by two corresponding ones of the inner spacers 16 and two corresponding ones of the second nanosheet segments 152. In some embodiments, the dummy gate dielectric 121 and the dummy gate 122 of each of the dummy stacks 12 are first removed to form the first voids 20, and the first nanosheet segments 151 are then removed to form the second voids 21.

Referring to FIG. 1 and the examples illustrated in FIG. 10, the method 100 proceeds to step S10, a plurality of interfacial layers 22 are formed. The interfacial layers 22 are formed around the second nanosheet segments 152 and on the semiconductor substrate 10. In some embodiments, the interfacial layers 22 may include a suitable low-k (low dielectric constant) nitrogen-free dielectric material (i.e., a dielectric material free of nitrogen, for example, but not limited to, silicon oxide, silicon oxycarbide, silicon carbide, or combinations thereof). In some embodiments, the interfacial layers 22 may be made by thermal oxidation or other suitable techniques.

Figure 11:
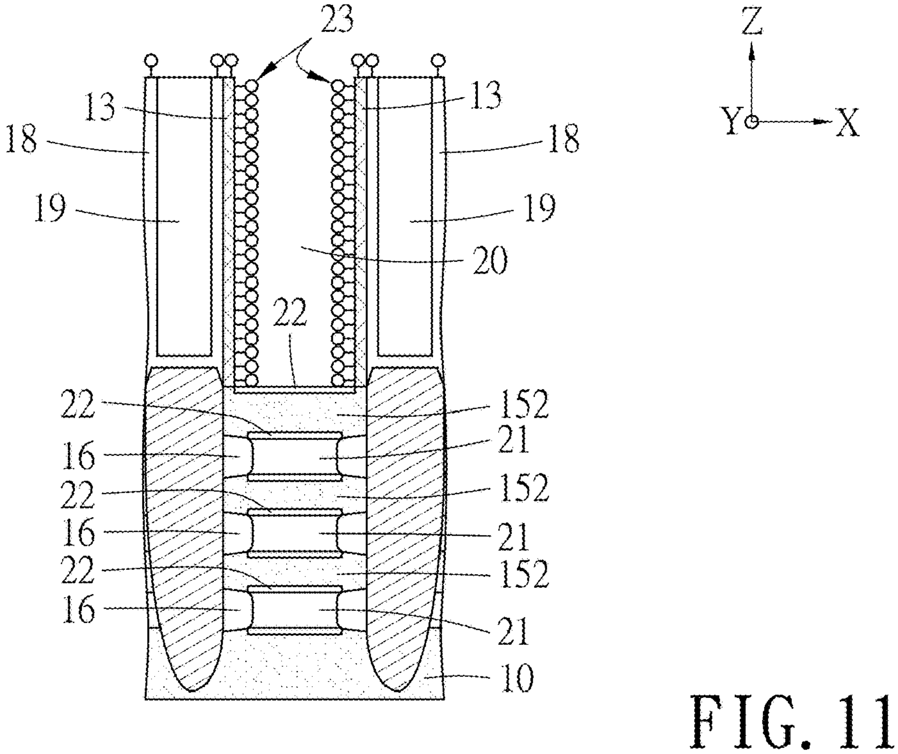

Referring to FIG. 1 and the example illustrated in FIG. 11, the method 100 proceeds to step S11, where a blocking layer 23 is formed. The blocking layer 23 is selectively formed to cover the spacers 13 so as to permit the interfacial layers 22 to be exposed to the first voids 20 and the second voids 21. In some embodiments, when the CESL 18 includes a nitrogen-containing dielectric material (for example, but not limited to, silicon nitride, carbon-doped silicon nitride, or a combination thereof), the blocking layer 23 may additionally cover an upper surface of the CESL 18, as shown in FIG. 11. In some embodiments, when the ILD layer 19 includes the nitrogen-containing dielectric material, the blocking layer 23 may also additionally cover an upper surface of the ILD layer 19. In some embodiments, when the inner spacers 16 includes the nitrogen-containing dielectric material, the blocking layer 23 may also additionally cover side surfaces of the inner spacers 16 which are exposed to the second voids 21.

Figure 12:
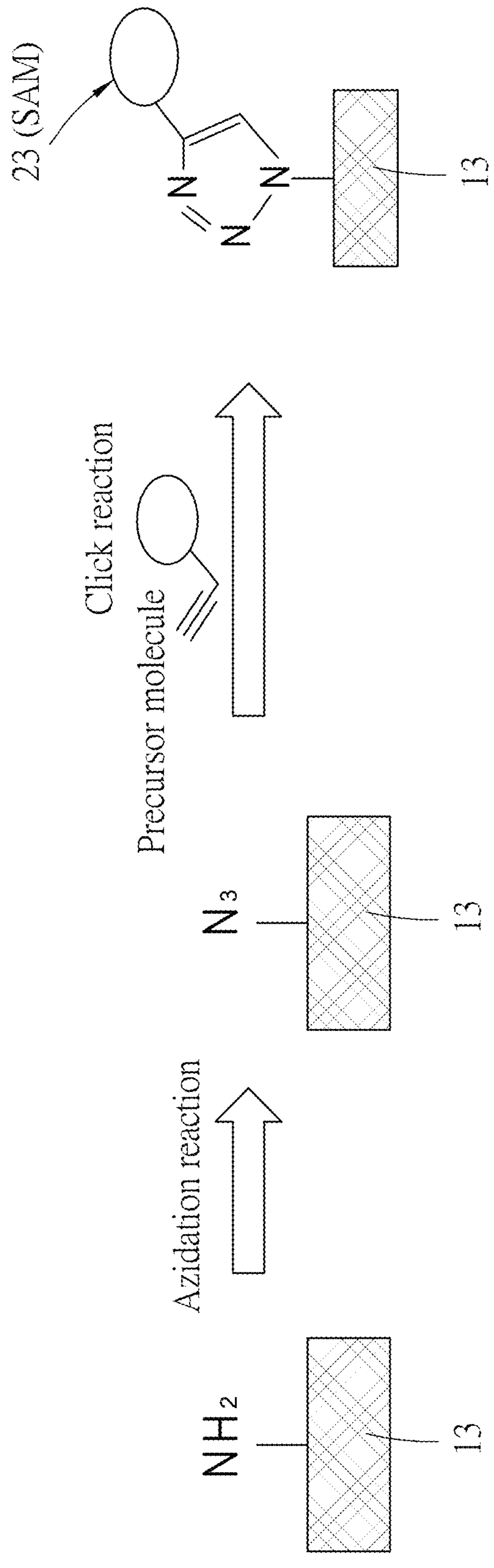

Referring to the example illustrated in FIG. 12, in some embodiments, the blocking layer 23 is a self-assembled monolayer (SAM) which is formed by an azidation reaction and a click reaction.

As described above with reference to FIG. 3, the spacers 13 include the nitrogen-containing dielectric material. Therefore, the spacers 13 are formed with nitrogen-containing radicals on surfaces thereof. In some embodiments, the nitrogen-containing radicals include, for example, but not limited to, amino ($-NH_2$) radicals. The nitrogen-containing radicals formed on the surfaces of the spacers 13 are subjected to the azidation reaction with an azide compound to form azide ($-N_3$) radicals on the surfaces of the spacers 13. In some embodiments, the azide compound used in the azidation reaction is in a form of a solution of the azide compound that is present in a solvent. In some embodiment, the azide compound includes, for example, a metal azide compound, an organic azide compound, or a combination thereof. In some embodiments, the metal azide compound includes for example, but not limited to, lithium azide ($LiN_3$), sodium azide ($NaN_3$), potassium azide ($KN_3$), or combinations thereof. In some embodiments, the organic azide compound includes, for example, but not limited to, trifluoromethanesulfonyl azide ($TfN_3$), imidazole-1-sulfonyl azide, 2-azido-1,3-dimethylimidazolinium hexafluorophosphate, or combinations thereof. Examples of the solvent used for the azidation reaction are not limited as long as the azide compound can be dissolved therein. In some embodiments, the solvent used for the azidation reaction includes, for example, but not limited to, water, methanol, dimethylformamide (DMF), toluene, tert-butyl nitrite ($BuNO_2$), tert-butanol (tBuOH), dichloromethane ($CH_2Cl_2$) dimethyl sulfoxide (DMSO), methyl tert-butyl ether (MTBE), or combinations thereof. In some embodiments, the solvent used for the azidation reaction includes a mixture of water and an organic solvent, wherein the organic solvent includes, for example, but not limited to, methanol, dimethylformamide (DMF), toluene, tert-butyl nitrite ($BuNO_2$), tert-butanol (tBuOH), dichloromethane ($CH_2Cl_2$), dimethyl sulfoxide (DMSO), methyl tert-butyl ether (MTBE), or combinations thereof. In some embodiments, the azidation reaction is conducted for a time period ranging from about 1 hour to about 120 hours. In some embodiments, the azidation reaction is conducted for a time period ranging from about 1 hour to about 27 hours. In some embodiments, the azidation reaction is conducted at a temperature ranging from about 0° C. to about 70° C. In some embodiments, the azidation reaction is conducted at a temperature ranging from about room temperature to about 70° C. In some embodiments, the azidation reaction is conducted at a temperature ranging from about 0° C. to about 10° C.

The azide radicals formed on the surfaces of the spacers 13 are subjected to the click reaction with a plurality of precursor molecules, so as to form the self-assembled monolayer (SAM) on the surfaces of the spacers 13 which serves as the blocking layer 23. Each of the precursor molecules is an alkyne molecule, and includes a head group and a tail group connected to the head group. An alkyne radical (—C≡C) of the alkyne molecule serves as the head group of each of the precursor molecules. In some embodiments, the tail group of each of the precursor molecules may be a linear or branched long chain which includes alkyl, aryl, other suitable groups, or combinations thereof. In some embodiments, the tail group of each of the precursor molecules is: a linear alkyl group of $CH_3(CH_2)_p$—, wherein p is an integer ranging from about 0 to about 20; a linear halo-substituted alkyl group of $CX_3(CX_2)_n(CH_2)_m$—, wherein X is selected from F, Cl, or Br, n is an integer ranging from about 0 to about 10, and m is an integer ranging from about 0 to about 10; or a combination thereof. The click reaction is a cycloaddition reaction between the azide radicals formed on the surfaces of the spacers 13 and the head groups (i.e., the alkyne radicals (—C≡C)) of the precursor molecules. The self-assembled monolayer (SAM) formed after the click reaction includes a plurality of the tail groups connected to the spacers 13 through a plurality of triazole radicals (see FIG. 12) formed by the cycloaddition reaction. The click reaction is conducted using a metal complex as a catalyst in the presence of a solvent. In some embodiments, the metal complex includes: a metal selected from copper (Cu), ruthenium (Ru), nickel (Ni), zinc (Zn), samarium (Sm), neodymium (Nd), yttrium (Y), or gadolinium (Gd); and a ligand selected from $NSiMe_3$, CsMes, $(C_5Me_5)_2$, $Et_2$, $(OTf)_3$, Br, Cl, I, or $(OAc)_2$, wherein Me indicates methyl, $Et_2$ indicates 6-fluoro-1H-benzimidazole-2-amine radical, Tf indicates trifluoromethanesulfonyl, and OAc indicates $O_2CCH_3$. In some embodiments, the solvent used for the click reaction includes, for example, but not limited to, water, toluene, butanol (BuOH), propylene glycol methyl ether (PGME), propylene glycol methyl ether acetate (PGMEA), or combinations thereof. In some embodiments, the solvent is a mixture of water and an organic solvent, wherein the organic solvent includes, for example, but not limited to, toluene, butanol (BuOH), propylene glycol methyl ether (PGME), propylene glycol methyl ether acetate (PGMEA), or combinations thereof. In some embodiments, the click reaction is conducted for a time period ranging from about 1 hour to about 120 hours. In some embodiments, the click reaction is conducted at a temperature ranging from about room temperature to about 70° C. The click reaction have characteristics such as high chemical specificity, high yield, and robust (i.e., insensitive to water and oxygen). In some embodiments, the yield of the click reaction may range from about 40% to about 100%.

Figure 13:
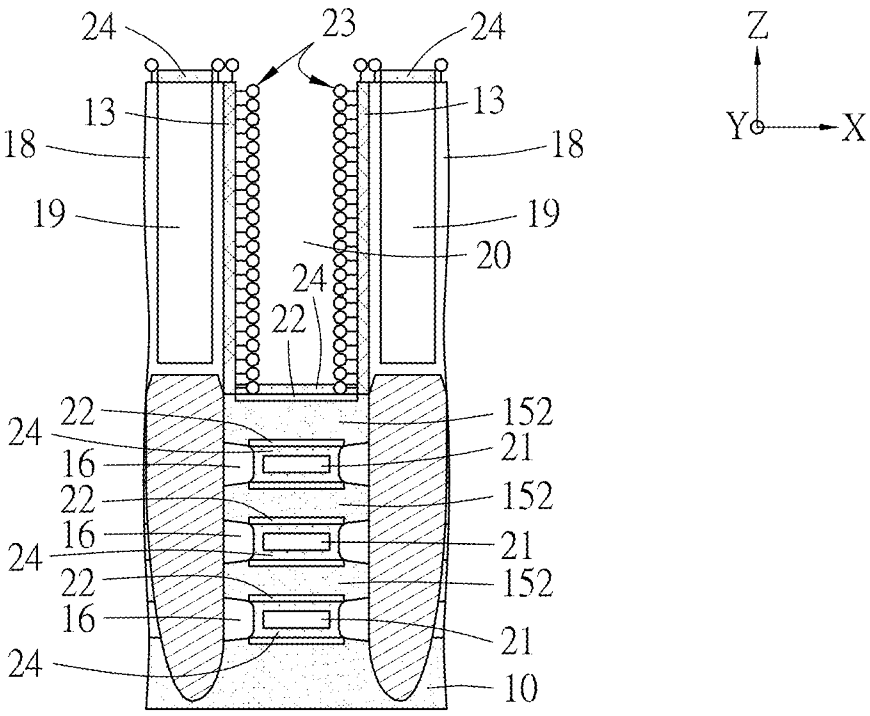

Referring to FIG. 1 and the example illustrated in FIG. 13, the method 100 proceeds to step S12, where a gate dielectric layer 24 is formed. The gate dielectric layer 24 is selectively formed on the interfacial layers 22 by a suitable deposition process as known to those skilled in the art of semiconductor fabrication, for example, but not limited to, PVD, CVD, PECVD, ALD, or PEALD, so as to surround the second nanosheet segments 152. Other suitable processes are within the contemplated scope of the present disclosure. In some embodiments, the gate dielectric layer 24 includes, for example, but not limited to, a high-k dielectric material, such as $HfO_2$, $ZrO_2$, HfSiO, HfSiON, HfTaO, HfTiO, HfZrO, other suitable high-k dielectric materials, or combinations thereof. Other suitable dielectric materials are within the contemplated scope of the present disclosure.

In some embodiments, when the ILD layer 19 includes the nitrogen-free dielectric material (for example, but not limited to, silicon oxide), the upper surface of the ILD layer 19 will not be covered by the blocking layer 23, and thus is also formed with the gate dielectric layer 24 thereon, as shown in FIG. 13. In some embodiments, when the inner spacers 16 includes the nitrogen-free dielectric material (for example, but not limited to, silicon oxide), the side surfaces of the inner spacers 16 will not be covered by the blocking layer 23, and thus are also formed with the gate dielectric layer 24 thereon, as shown in FIG. 13.

Figure 14:
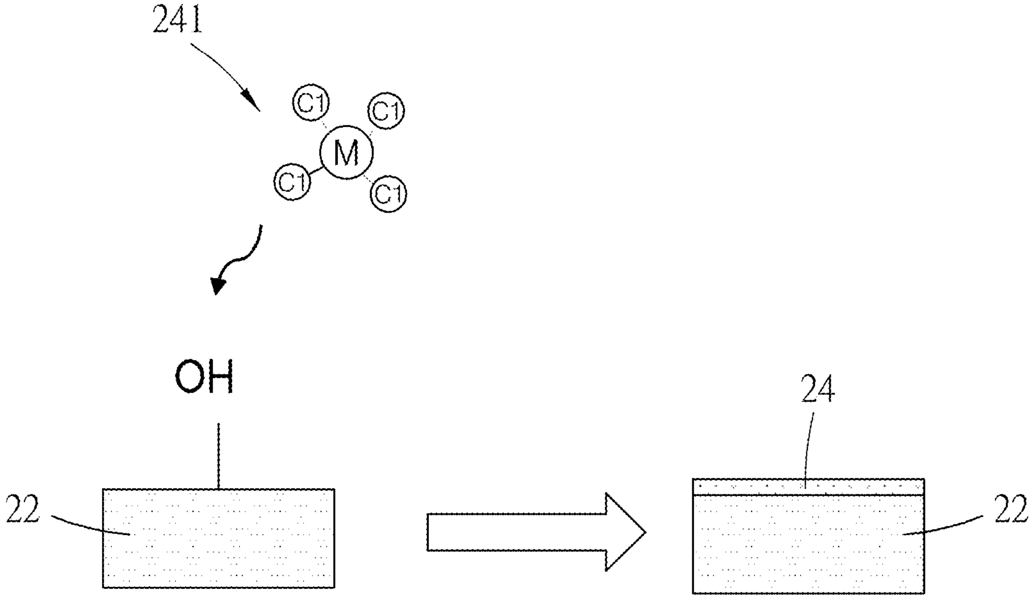
Figure 15:
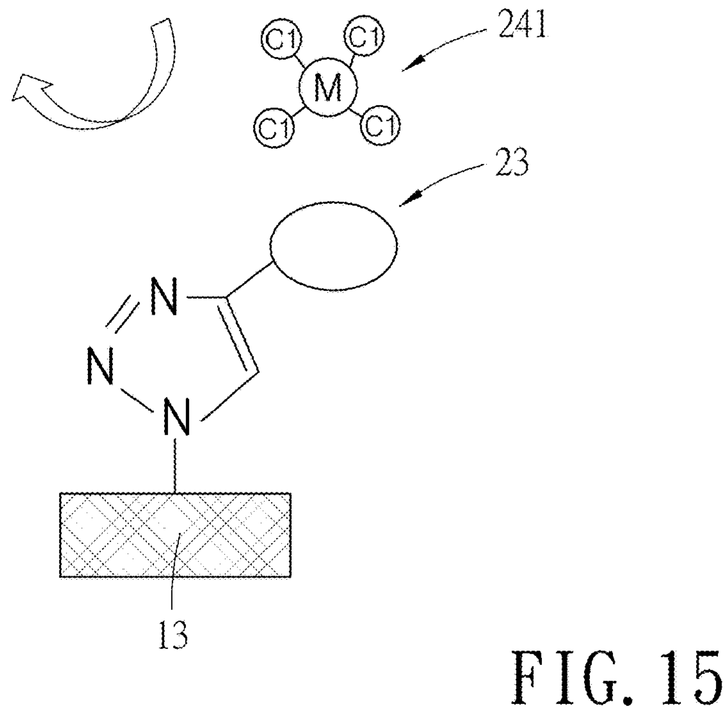

Referring to the examples illustrated in FIGS. 14 and 15, the gate dielectric layer 24 is formed using a precursor compound 241. In some embodiments, the precursor compound 241 includes, for example, but not limited to, metal halide. In some embodiments, the metal halide is metal chloride, as shown in FIGS. 14 and 15. When a suitable deposition (for example, but not limited to, ALD or CVD) is conducted to form the gate dielectric layer 24, the precursor compound 241 is reacted with hydroxyl groups formed on the surfaces of the interfacial layers 22 (and optionally the ILD layer 19 and/or the inner spacers 16), which includes the nitrogen-free dielectric material (for example, but not limited to, silicon oxide), to form the gate dielectric layer 24 (see FIG. 14). In addition, since the spacers 13 are covered by the blocking layer 23 (i.e., the SAM), when the suitable deposition (for example, but not limited to, ALD) is conducted to form the gate dielectric layer 24, the spacers 13 are covered by the blocking layer 23. Therefore, the precursor compound 241 approaching the spacers 13 is blocked by the blocking layer 23 (see FIG. 15), such that the gate dielectric layer 24 is not formed on the side surfaces of the spacers 13.

Figure 16:
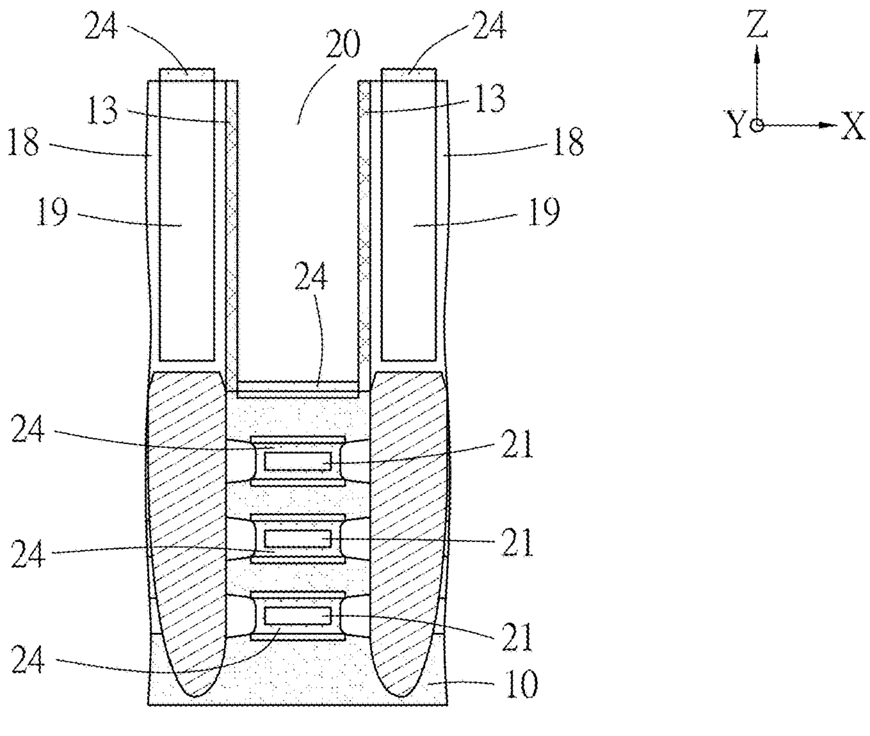

Referring to FIG. 1 and the examples illustrated in FIGS. 13 and 16, the method 100 proceeds to step S13, where the blocking layer 23 is removed. The blocking layer 23 of the structure shown in FIG. 13 is removed after the gate dielectric layer 24 is formed. In some embodiments, the blocking layer 23 may be removed by an ashing process using oxygen gas as a gas source. In some embodiments, the blocking layer 23 may be removed by an ashing process using a mixture of hydrogen gas and nitrogen gas as a gas source. In some embodiments, the blocking layer 23 may be removed by an ultraviolet-ozone (UV-O3) treatment process. In some embodiments, the blocking layer 23 may be removed by a thermal treatment process. Other suitable processes for removing the blocking layer 23 are within the contemplated scope of the present disclosure.

Referring to FIG. 1 and the examples illustrated in FIGS. 16 and 17, the method 100 proceeds to step S14, where a metal filling layer 25 is formed in the first voids 20 and the second voids 21, and over the ILD layer 19, the CESL 18, and the spacers 13 through a suitable deposition process, for example, but not limited to, PVD, CVD, PECVD, ALD, PEALD, or sputtering. Other suitable processes are within the contemplated scope of the present disclosure. In some embodiments, the metal filling layer 25 may include a barrier sub-layer, a work function sub-layer, and a filling material sub-layer. The barrier sub-layer may prevent diffusion of metal into the spacers 13. Examples of a material suitable for the work function sub-layer may include, for example, but not limited to, titanium, aluminum, tantalum carbide, tantalum carbide nitride, tantalum silicon nitride, and combinations thereof. Examples of a material suitable for the filling material sub-layer may include, for example, but not limited to, aluminum, tungsten, copper, other conductive metals, and combinations thereof.

Referring to FIG. 1 and the examples illustrated in FIGS. 17 and 18, the method 100 proceeds to step S15, where an excess portion of the metal filling layer 25 and top portions of the gate dielectric layer 24 are removed. The excess portion of the metal filling layer 25 and the top portions of the gate dielectric layer 24 (if present, as shown in FIG. 17) over the ILD layer 19 are removed by a planarization process (for example, but not limited to, CMP) to form gate structures 26, each of which includes a top gate portion 261 disposed over a corresponding one of the channel regions 15, and a lower gate portion 262 surrounding the second nanosheet segments 152. One of the gate structures 26 is shown in FIG. 18. The lower gate portion 262 includes the gate dielectric layer 24 surrounding the second nanosheet segments 152, and the metal filling layer 25 which surrounds the gate dielectric layer 24 and which is separated from the second nanosheet segments 152 by the gate dielectric layer 24. Each pair of the spacers 13 covers two opposite side surfaces of the top gate portion 261 of a corresponding one of the gate structures 26. The top gate portion 261 of each of the gate structures 26 includes the metal filling layer 25 that is in direct contact with two corresponding ones of the spacers 13 without the gate dielectric layer 24, which includes the high-k dielectric material, being formed between the metal filling layer 25 and the two corresponding ones of the spacers 13. Therefore, a parasitic capacitance of the semiconductor device 200 thus manufactured can be reduced, and a resistance-capacitance (RC) time delay for the semiconductor device 200 can be reduced and device performance of the semiconductor device 200 can be boosted accordingly.

In a method for manufacturing a semiconductor device of the present disclosure, a self-assembled monolayer (SAM) formed by an azidation reaction and a click reaction serves as a blocking layer to cover spacers. Therefore, a top gate portion of each of gate structures of a semiconductor device thus manufactured is in direct contact with two corresponding ones of the spacers without the gate dielectric layer, which includes a high-k dielectric material, being formed between the top gate portion and the two corresponding ones of the spacers. Therefore, a parasitic capacitance of the semiconductor device can be reduced, and a resistance-capacitance (RC) time delay for the semiconductor device can be reduced accordingly.

In accordance with some embodiments of the present disclosure, a method for manufacturing a semiconductor device includes: forming a semiconductor structure on a substrate, the semiconductor structure including a pair of source/drain regions, a channel region disposed between the source/drain regions and including a plurality of nanosheet segments which are connected between the source/drain regions in an X direction parallel to a bottom surface of the substrate and which are spaced apart from each other in a Z direction transverse to the X direction, and a pair of spacers extending upwardly from the channel region in the Z direction and spaced apart from each other in the X direction so as to define a void between the spacers, the spacers including a nitrogen-containing dielectric material; forming a blocking layer to cover side surfaces of the spacers facing the void by subjecting the nitrogen-containing dielectric material to an azidation reaction with an azide compound and a click reaction with a plurality of precursor molecules, each of which includes a head group containing an alkyne radical and a tail group connected to the head group; forming a gate dielectric layer surrounding the nanosheet segments; removing the blocking layer; and forming a metal filling layer which fills the void so as to be in direct contact with the spacers, and which surrounds the nanosheet segments and is separated from the nanosheet segments by the gate dielectric layer.

In accordance with some embodiments of the present disclosure, the side surfaces of the spacers are formed with a plurality of amino radicals to conduct the azidation reaction with the azide compound so as to form a plurality of azide radicals on the side surfaces of the spacers. The click reaction is conducted with the azide radicals and the precursor molecules to form a plurality of triazole radicals to permit the tail group of each of the precursor molecules to be connected to the side surfaces of the spacers via a corresponding one of the triazole radicals so as to form the blocking layer.

In accordance with some embodiments of the present disclosure, the azide compound includes a metal azide compound, an organic azide compound, or a combination thereof.

In accordance with some embodiments of the present disclosure, the metal azide compound includes lithium azide, sodium azide, potassium azide, or combinations thereof.

In accordance with some embodiments of the present disclosure, the organic azide compound includes trifluoromethanesulfonyl azide, imidazole-1-sulfonyl azide, 2-azido-1,3-dimethylimidazolinium hexafluorophosphate, or combinations thereof.

In accordance with some embodiments of the present disclosure, the azide compound is present in a solvent which includes water, methanol, dimethylformamide, toluene, tert-butyl nitrite, tert-butanol, dichloromethane, dimethyl sulfoxide, methyl tert-butyl ether, or combinations thereof.

In accordance with some embodiments of the present disclosure, the azidation reaction is conducted for a time period ranging from 1 hour to 120 hours.

In accordance with some embodiments of the present disclosure, the azidation reaction is conducted at a temperature ranging from 0° C. to 70° C.

In accordance with some embodiments of the present disclosure, the tail group is a linear alkyl group of $CH_3(CH_2)_p$—, wherein p is an integer ranging from 0 to 20; or a linear halo-substituted alkyl group of $CX_3(CX_2)_n(CH_2)_m$—, wherein X is selected from F, Cl, or Br, n is an integer ranging from 0 to 10, and m is an integer ranging from 0 to 10.

In accordance with some embodiments of the present disclosure, the click reaction is conducted using a metal complex as a catalyst.

In accordance with some embodiments of the present disclosure, the metal complex includes a metal selected from Cu, Ru, Ni, Zn, Sm, Nd, Y, or Gd; and a ligand selected from $NSiMe_3$, $C_5Me_5$, $(C_5Me_5)_2$, $Et_2$, $(OTf)_3$, Br, Cl, I, or $(OAc)_2$.

In accordance with some embodiments of the present disclosure, the metal complex is present in a solvent which includes water, toluene, butanol, propylene glycol methyl ether, propylene glycol methyl ether acetate, or combinations thereof.

In accordance with some embodiments of the present disclosure, the click reaction is conducted for a time period ranging from 1 hour to 120 hours.

In accordance with some embodiments of the present disclosure, the click reaction is conducted at a temperature ranging from room temperature to 70° C.

In accordance with some embodiments of the present disclosure, a method for manufacturing a semiconductor device includes: forming a semiconductor structure on a substrate, the semiconductor structure including a pair of source/drain regions spaced apart from each other, a plurality of nanosheet segments connected between the source/drain regions and spaced apart from each other in a vertical direction perpendicular to the substrate, a plurality of interfacial layers respectively disposed on the nanosheet segments and including a nitrogen-free dielectric material, and a pair of spacers extending upwardly from the nanosheet segments in the vertical direction and spaced apart from each other so as to define a void between the spacers, the spacers including a nitrogen-containing dielectric material; forming a blocking layer to cover side surfaces of the spacers facing the void by subjecting the nitrogen-containing dielectric material to an azidation reaction with an azide compound and a click reaction with a plurality of precursor molecules, each of which includes a head group containing an alkyne radical and a tail group connected to the head group; forming a gate dielectric layer on the interfacial layers so as to surround the nanosheet segments; removing the blocking layer; and forming a metal filling layer which fills the void so as to be in direct contact with the spacers, and which surrounds the nanosheet segments and is separated from the nanosheet segments by the gate dielectric layer and the interfacial layers.

In accordance with some embodiments of the present disclosure, the nitrogen-containing dielectric material includes silicon nitride, silicon oxynitride, silicon carbonitride, silicon oxycarbonitride, or combinations thereof.

In accordance with some embodiments of the present disclosure, the nitrogen-free dielectric material includes silicon oxide, silicon oxycarbide, silicon carbide, or combinations thereof.

In accordance with some embodiments of the present disclosure, the side surfaces of the spacers are formed with a plurality of amino radicals to conduct the azidation reaction with the azide compound so as to form a plurality of azide radicals on the side surfaces of the spacers. The click reaction is conducted with the azide radicals and the precursor molecules to form a plurality of triazole radicals to permit the tail group of each of the precursor molecules to be connected to the side surfaces of the spacers via a corresponding one of the triazole radicals so as to form the blocking layer. The click reaction is a cycloaddition reaction between each of the azide radicals and the alkyne radical of a corresponding one of the precursor molecules.

In accordance with some embodiments of the present disclosure, a semiconductor device includes a substrate, a pair of source/drain regions disposed on the substrate, a channel region disposed on the substrate and between the source/drain regions, a gate structure, and a pair of spacers. The channel region includes a plurality of nanosheet segments connected between the source/drain regions and spaced apart from each other in a vertical direction perpendicular to the substrate. The gate structure includes a top gate portion disposed over the channel region and a lower gate portion surrounding the nanosheet segments, the top gate portion including a metal filling layer. The spacers respectively cover two opposite side surfaces of the top gate portion and are in direct contact with the metal filling layer.

In accordance with some embodiments of the present disclosure, the lower gate portion includes a gate dielectric layer surrounding the nanosheet segments, and the metal filling layer surrounding the gate dielectric layer and separated from the nanosheet segments by the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a semiconductor structure on a substrate, the semiconductor structure including:

a pair of source/drain regions, a channel region disposed between the pair of source/drain regions and including a plurality of nanosheet segments which are connected between the pair of source/drain regions in a first direction parallel to a bottom surface of the substrate and which are spaced apart from each other in a second direction transverse to the first direction, and a pair of spacers extending upwardly from the channel region in the second direction and spaced apart from each other in the first direction so as to define a void between the pair of spacers, the pair of spacers including a nitrogen-containing dielectric material;

forming a blocking layer to cover side surfaces of the pair of spacers facing the void by subjecting the nitrogen-containing dielectric material to an azidation reaction with an azide compound and a click reaction with a plurality of precursor molecules, one of which includes a head group containing an alkyne radical and a tail group connected to the head group;

forming a gate dielectric layer surrounding the plurality of nanosheet segments;

removing the blocking layer; and forming a metal filling layer which fills the void so as to be in direct contact with the pair of spacers, and which surrounds the plurality of nanosheet segments and is separated from plurality of the nanosheet segments by the gate dielectric layer.

2. The method according to claim 1, wherein the side surfaces of the pair of spacers are formed with a plurality of amino radicals to conduct the azidation reaction with the azide compound so as to form a plurality of azide radicals on the side surfaces of the pair of spacers, and the click reaction is conducted with the plurality of azide radicals and the plurality of precursor molecules to form a plurality of triazole radicals to permit the tail group of one of the plurality of precursor molecules to be connected to the side surfaces of the pair of spacers via a corresponding one of the plurality of triazole radicals so as to form the blocking layer.

3. The method according to claim 1, wherein the azide compound includes a metal azide compound, an organic azide compound, or a combination thereof.

4. The method according to claim 3, wherein the metal azide compound includes lithium azide, sodium azide, potassium azide, or combinations thereof.

5. The method according to claim 3, wherein the organic azide compound includes trifluoromethanesulfonyl azide, imidazole-1-sulfonyl azide, 2-azido-1,3-dimethylimidazolinium hexafluorophosphate, or combinations thereof.

6. The method according to claim 1, wherein the azide compound is present in a solvent which includes water, methanol, dimethylformamide, toluene, tert-butyl nitrite, tert-butanol, dichloromethane, dimethyl sulfoxide, methyl tert-butyl ether, or combinations thereof.

7. The method according to claim 1, wherein the azidation reaction is conducted for a time period ranging from 1 hour to 120 hours.

8. The method according to claim 1, wherein the azidation reaction is conducted at a temperature ranging from 0° C. to 70° C.

9. The method according to claim 1, wherein the tail group is a linear alkyl group of $CH_3(CH_2)_p$—, wherein p is an integer ranging from 0 to 20; or a linear halo-substituted alkyl group of $CX_3(CX_2)_n(CH_2)_m$—, wherein X is selected from F, Cl, or Br, n is an integer ranging from 0 to 10, and m is an integer ranging from 0 to 10.

10. The method according to claim 1, wherein the click reaction is conducted using a metal complex as a catalyst.

11. The method according to claim 10, wherein the metal complex includes a metal selected from Cu, Ru, Ni, Zn, Sm, Nd, Y, or Gd; and a ligand selected from $NSiMe_3$, $C_5Me_5$, $(C_5Me_5)_2$, $Et_2$, $(OTf)_3$, Br, Cl, I, or $(OAc)_2$.

12. The method according to claim 10, wherein the metal complex is present in a solvent which includes water, toluene, butanol, propylene glycol methyl ether, propylene glycol methyl ether acetate, or combinations thereof.

13. The method according to claim 1, wherein the click reaction is conducted for a time period ranging from 1 hour to 120 hours.

14. The method according to claim 1, wherein the click reaction is conducted at a temperature ranging from room temperature to 70° C.

15. A method for manufacturing a semiconductor device, comprising:

forming a semiconductor structure on a substrate, the semiconductor structure including:

a pair of source/drain regions spaced apart from each other, a plurality of nanosheet segments connected between the pair of source/drain regions and spaced apart from each other in a vertical direction perpendicular to the substrate, a plurality of interfacial layers respectively disposed on the plurality of nanosheet segments and including a nitrogen-free dielectric material, and a pair of spacers extending upwardly from the plurality of nanosheet segments in the vertical direction and spaced apart from each other so as to define a void between the pair of spacers, the pair of spacers including a nitrogen-containing dielectric material;

forming a blocking layer to cover side surfaces of the pair of spacers facing the void by subjecting the nitrogen-containing dielectric material to an azidation reaction with an azide compound and a click reaction with a plurality of precursor molecules, one of which includes a head group containing an alkyne radical and a tail group connected to the head group;

forming a gate dielectric layer on the plurality of interfacial layers so as to surround the plurality of nanosheet segments;

removing the blocking layer; and forming a metal filling layer which fills the void so as to be in direct contact with the pair of spacers, and which surrounds the plurality of nanosheet segments and is separated from the plurality of nanosheet segments by the gate dielectric layer and the plurality of interfacial layers.

16. The method according to claim 15, wherein the nitrogen-containing dielectric material includes silicon nitride, silicon oxynitride, silicon carbonitride, silicon oxycarbonitride, or combinations thereof.

17. The method according to claim 15, wherein the nitrogen-free dielectric material includes silicon oxide, silicon oxycarbide, silicon carbide, or combinations thereof.

18. The method according to claim 15, wherein the side surfaces of the pair of spacers are formed with a plurality of amino radicals to conduct the azidation reaction with the azide compound so as to form a plurality of azide radicals on the side surfaces of the pair of spacers, the click reaction is conducted with the plurality of azide radicals and the plurality of precursor molecules to form a plurality of triazole radicals to permit the tail group of one of the plurality of precursor molecules to be connected to the side surfaces of the pair of spacers via a corresponding one of the plurality of triazole radicals so as to form the blocking layer, and the click reaction is a cycloaddition reaction between one of the plurality of azide radicals and the alkyne radical of a corresponding one of the precursor molecules.

19. A method for manufacturing a semiconductor device, comprising:

forming a semiconductor structure on a substrate, the semiconductor structure including:

a first source/drain region and a second source/drain region spaced apart from each other in a first direction parallel to a bottom surface of the substrate, a channel region disposed between the first source/drain region and the second source/drain region in the first direction, a first spacer and a second spacer extending upwardly from the channel region in a second direction different from the first direction and spaced apart from each other in the first direction so as to define a void between the first spacer and the second spacer, the first spacer and the second spacer including a first nitrogen-containing dielectric material, and an etch stop layer including a first etch stop layer portion and a second etch stop layer portion which extend upwardly in the second direction from the first source/drain region and the second source, respectively, and which are laterally covered by the first spacer and the second spacer, respectively, the etch stop layer including a second nitrogen-containing dielectric material;

forming a blocking layer to cover a first side surface of the first spacer and a second side surface of the second spacer facing the void and to cover an upper surface of one of the first etch stop layer portion and the second etch stop layer portion by subjecting the first nitrogen-containing dielectric material and the second nitrogen-containing dielectric material to an azidation reaction with an azide compound and a click reaction with a plurality of precursor molecules, one of which includes a head group containing an alkyne radical and a tail group connected to the head group;

forming a gate dielectric layer surrounding the channel region;

removing the blocking layer; and forming a metal filling layer which fills the void so as to be in direct contact with the first spacer and the second spacer, and which surrounds the channel region and is separated from the channel region by the gate dielectric layer.

20. The method according to claim 19, wherein the semiconductor structure further includes an interlayer dielectric layer including a first dielectric layer portion and a second dielectric layer portion which are disposed on the first etch stop layer portion and the second etch stop layer portion, respectively, the interlayer dielectric layer including a third nitrogen-containing dielectric material; and an upper surface of one of the first dielectric layer portion and the second dielectric layer portion is covered by the block layer by subjecting the third nitrogen-containing dielectric material to the azidation reaction and the click reaction.

* * * * *